(12) United States Patent  (10) Patent No.: US 7,932,549 B2
Holmes et al.  (45) Date of Patent: Apr. 26, 2011

(54) CARBON NANOTUBE CONDUCTOR FOR TRENCH CAPACITORS

(75) Inventors: Steven J. Holmes, Guilderland, NY (US); Toshiharu Furukawa, Essex Junction, VT (US); Mark C. Hakey, Fairfax, VT (US); David V. Horak, Essex Junction, VT (US); Charles W. Koburger, III, Delmar, NY (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 802 days.

(21) Appl. No.: 10/596,022

(22) PCT Filed: Dec. 18, 2003

(86) PCT No.: PCT/US03/40295
§ 371 (c)(1),
(2), (4) Date: May 25, 2006

(87) PCT Pub. No.: WO2005/069372
PCT Pub. Date: Jul. 28, 2005

(65) Prior Publication Data
US 2009/0014767 A1    Jan. 15, 2009

(51) Int. Cl.
*H01L 27/108* (2006.01)
(52) U.S. Cl. ............ 257/301; 257/68; 257/71; 257/296; 257/300; 257/E27.084; 257/E27.092; 257/E23.039; 257/E51.04; 438/243; 438/386; 438/775; 438/776; 977/936; 977/943; 977/948

(58) Field of Classification Search ............... 257/68, 257/71, 296, 298, 300, 301, 303, E51.038, 257/E51.039, E51.04, E23.074, E27.084, 257/E21.646, E27.092; 438/775, 776, 777, 438/243, 386; 977/943, 936, 948
See application file for complete search history.

(56) References Cited

U.S. PATENT DOCUMENTS

| | | | |
|---|---|---|---|
| 6,286,226 B1 | 9/2001 | Jin | |
| 6,333,598 B1 * | 12/2001 | Hsu et al. | 313/495 |
| 6,340,822 B1 | 1/2002 | Brown et al. | |
| 6,515,325 B1 | 2/2003 | Farnworth et al. | |
| 6,566,704 B2 | 5/2003 | Choi et al. | |
| 6,599,808 B2 | 7/2003 | Kim et al. | |
| 2001/0012658 A1 * | 8/2001 | Widmann et al. | 438/241 |

(Continued)

OTHER PUBLICATIONS

Yoshikazu Homma, Growth of Suspended carbon nanotube networks on 100-nm scale silicon pillars, Applied Physics Letters, vol. 81, No. 12, Sep. 16, 2002, pp. 2261-2263.*

(Continued)

*Primary Examiner* — Lynne A Gurley
*Assistant Examiner* — Yosef Gebreyesus
(74) *Attorney, Agent, or Firm* — Yuanmin Cai

(57) ABSTRACT

A trench-type storage device includes a trench in a substrate (100), with bundles of carbon nanotubes (202) lining the trench and a trench conductor (300) filling the trench. A trench dielectric (200) may be formed between the carbon nanotubes and the sidewall of the trench. The bundles of carbon nanotubes form an open cylinder structure lining the trench. The device is formed by providing a carbon nanotube catalyst structure on the substrate and patterning the trench in the substrate; the carbon nanotubes are then grown down into the trench to line the trench with the carbon nanotube bundles, after which the trench is filled with the trench conductor.

20 Claims, 2 Drawing Sheets

U.S. PATENT DOCUMENTS

| | | | |
|---|---|---|---|
| 2002/0048143 A1* | 4/2002 | Lee et al. | 361/502 |
| 2002/0130388 A1* | 9/2002 | Stamper | 257/532 |
| 2002/0151150 A1* | 10/2002 | Bernstein et al. | 438/396 |
| 2002/0159944 A1* | 10/2002 | Smalley et al. | 423/447.6 |
| 2002/0163079 A1 | 11/2002 | Awano | |
| 2003/0096104 A1* | 5/2003 | Tobita et al. | 428/332 |
| 2003/0100189 A1 | 5/2003 | Lee et al. | |
| 2003/0132461 A1* | 7/2003 | Roesner et al. | 257/213 |
| 2003/0165418 A1 | 9/2003 | Ajayan et al. | |
| 2003/0179559 A1 | 9/2003 | Engelhardt et al. | |
| 2003/0211724 A1* | 11/2003 | Haase | 438/629 |
| 2004/0043629 A1* | 3/2004 | Lee et al. | 438/775 |
| 2004/0137730 A1* | 7/2004 | Kim et al. | 438/689 |
| 2005/0062034 A1* | 3/2005 | Dubin | 257/20 |

OTHER PUBLICATIONS

Yoshikazu Homma, Growth of suspended carbon nanotube networks on 100-nm -scale silicon pillars, Sep. 16, 2002 , vol. 81, No. 12, pp. 2261-2263 (Applied physics letters).*

Yoshikazu Homma, Growth of suspended carbon nanotube networks on 100-nm scale pillars, Sep. 16, 2002, Applied physics letters, vol. 81, No. 12, pp. 2261-2263.*

Yoshikazu Hmma, Growth of suspended carbon nanotube networks on 100-nm scale pillars, Sep. 16, 2002, Applied physics letters, vol. 81, No. 12, pp. 2261-2263.*

International Search Report and Written Opinion Filing Date: Dec. 18, 2003.

* cited by examiner

CARBON NANOTUBE CONDUCTOR FOR TRENCH CAPACITORS

CROSS-REFERENCE TO RELATED APPLICATIONS

The present application is a National Phase Application of International Application PCT/US2003/040295 entitled "Carbon Nanotube Conductor for Trench Capacitors", which was filed on Dec. 18, 2003 and published under WO2005/069372A1 on Jul. 28, 2005.

TECHNICAL FIELD

The present invention generally relates to deep trench capacitors and more particularly to the use of a carbon nanotube film as a trench liner in deep trench capacitors.

BACKGROUND ART

Most methods of fabricating DRAM trench storage nodes use silicon as a trench conductor material. As the trenches get deeper and achieve a higher aspect ratio, it requires more time to access the stored charge in the trench. It is difficult to use more conductive materials, such as aluminum, copper or platinum, in the trench due to the high thermal cycles that are required in the dynamic random access memory (DRAM) device fabrication.

Carbon nanotubes have recently attracted attention for use in very high-density integrated circuit devices. For example, U.S. Pat. No. 6,515,325 describes a vertical transistor and capacitor cell using a single nanotube to form a device. U.S. Pat. No. 6,566,704 describes a transistor including vertical nanotubes in which the source and drain are respectively formed at lower and upper parts of the nanotubes. These patents also describe processes for growing a nanotube on a substrate, where the nanotube is grown upwards from the substrate.

In order to employ carbon nanotubes in a trench-type capacitor memory device, it is necessary to form the nanotubes in a structure suitable for a storage node trench. This in turn requires that the nanotubes be grown down into the trench. The present invention addresses this problem.

DISCLOSURE OF INVENTION

The invention provides a trench-type storage device (capacitor) having multiple conductive carbon nanotubes forming an open-ended cylinder structure lining the trench. A non-carbon based trench conductor (e.g., polysilicon, metals, alloys, etc.) fills the trench inside the open cylinder structure of carbon nanotube bundles. More specifically, in a process for making the invention, a carbon nanotube catalyst structure is formed on a substrate and at least one trench is patterned in the substrate. Then, the process grows multiple carbon nanotubes down into the trench to line the trench with carbon nanotubes bundles, after which the invention fills the trench with the trench conductor.

Prior to growing the carbon nanotubes, a porous cap may be formed over the carbon nanotube catalyst to further promote exposure of the catalyst to the carbon material. The process forms the carbon nanotubes catalyst structure by first forming a least one pad layer and then forming a carbon nanotube catalyst on the pad layer. After the trench is patterned, additional etching of the trench is performed to create an undercut beneath the carbon nanotube catalyst structure. Then, a portion of the pad layer is removed to expose the carbon nanotube catalyst. The process grows the carbon nanotubes from the top opening portion of the trench, down sidewalls of the trench, to the bottom closed portion of the trench. The carbon nanotubes form a consistent lining along approximately the entire length of sidewalls of the trench.

A trench dielectric can be positioned between the carbon nanotubes and sidewalls of the trench. The trench conductor comprises one or more of polysilicon, metal, an alloy, etc., and is carbon free. Further, in the final structure, the substrate is free of carbon nanotube catalyst materials because the catalyst is removed by the inventive process.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

BEST MODE FOR CARRYING OUT THE INVENTION

Figure 1:
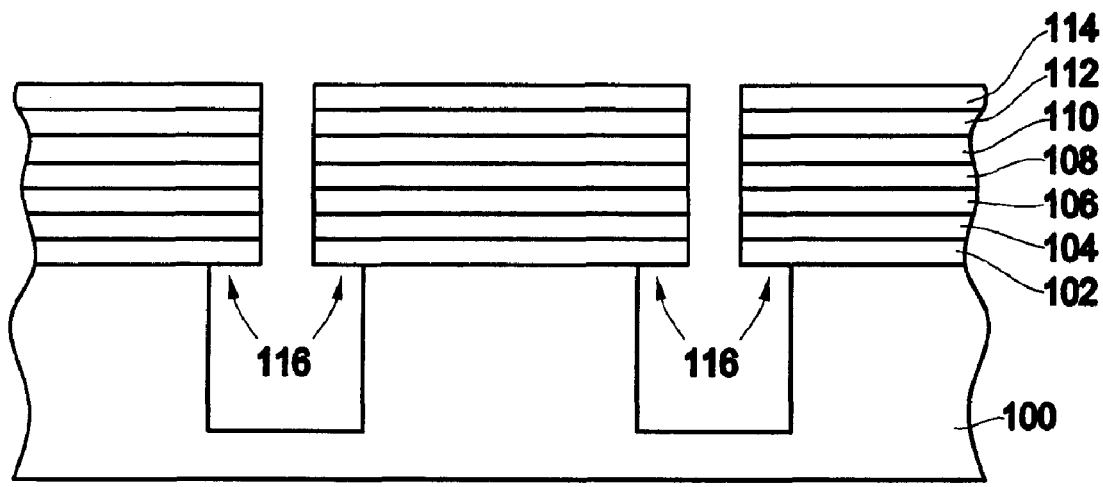
FIG. 1 is a schematic diagram of a partially completed trench-type storage device.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The present invention uses carbon nanotubes (CNT) to help form the conductive material in the trench. Most approaches to growing carbon nanotubes use a catalyst buried in the substrate and grow the carbon nanotubes up the trench from the bottom or middle. This approach does not work well for filling a deep trench because the trench becomes clogged with carbon nanotube material which blocks access of the source gas to the catalyst when the catalyst is placed at the bottom or sides of the trench. The present invention places the catalyst at the top of the trench, and allows the carbon nanotube to grow down into the trench, while fresh source gas is able to access the catalyst through a porous cap over the catalyst. The pores do not get clogged with carbon nanotubes because the tubes grow out from the catalyst surface rather than down into the catalyst.

The thicknesses and materials used in the following example explain one manner in which the invention is embodied. One ordinarily skilled in the art would understand that many different substances of many different thicknesses can be utilized in place of the materials and dimension mentioned below. Further, all measurements and chemical concentrations used herein are approximates. Therefore, as mentioned above, the following example should not be construed as limiting the scope of the invention. As shown in FIG. 1, the invention starts with a pad structure on a substrate 100 that includes, for example, a 10 nm oxide layer (102), a 100 nm nitride layer (104) and 10 nm layer of Nickel, Iron, or Cobalt (or other suitable catalyst for carbon nanotube formation) 106. Item 108 represents a porous material, such as 200 nm of porous insulator (porous silicon oxide, such as formed from spun on glass (SOG) material with a component of volatile materials that escape during anneal). On top of the SOG, 500-800 nm of silicon oxide hard mask 110 is placed to mask the etch of the deep trench. On top of the oxide hard mask is placed 200 nm of silicon nitride hard mask 112, to provide a mask to etch the oxide 110.

The invention then applies an organic anti-reflective coating (ARC) and photoresist 114, and exposes the trench pattern into the photoresist 114. The invention performs the standard post exposure baking of the resist and developing of the resist pattern. Then, the invention etches the resist pattern into the nitride hard mask 112, and transfers the pattern through the rest of the pad stack and into the silicon substrate 100. After the trench is etched, the invention uses a brief isotropic silicon etch to perform additional trench widening and allow the pad structure to extend slightly over the trench, for example, about 10 nm per edge as shown by arrow 116. After the trench is widened, the trench dielectric 200 is formed according to methods known in the art; for example, deposition of silicon nitride of approximately 2 nm followed by thermal oxidation.

Figure 2:
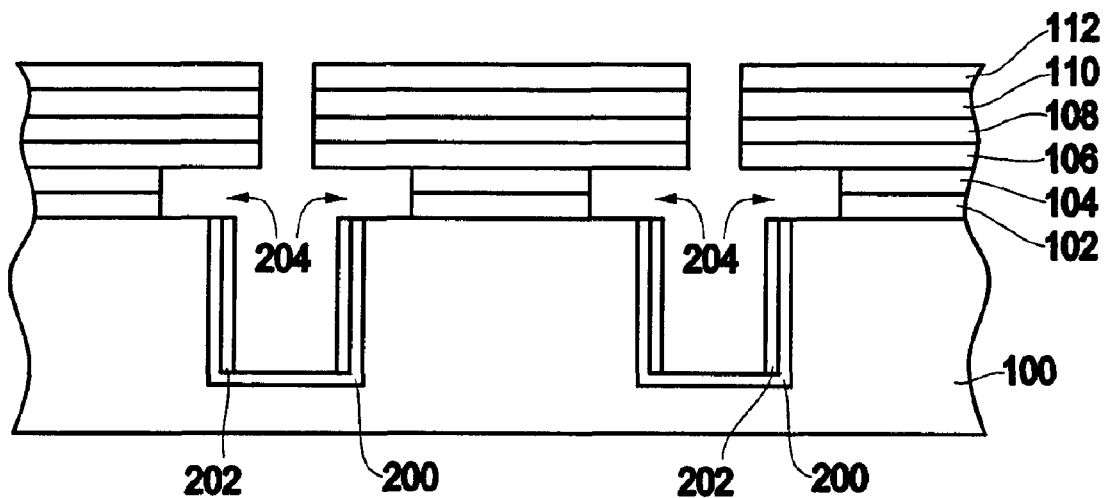
FIG. 2 is a schematic diagram of a partially completed trench-type storage device.

As shown in FIG. 2, the process for making a preferred embodiment of the invention removes portions of the trench dielectric, the oxide layer 102 and the nitride layer 104 at the bottom of the pad structure, to expose the metallic catalyst 106 to the process ambient. This is done by isotropic etching (as indicated by arrows 204) of the trench dielectric, oxide 102 and nitride 104, while protecting the trench dielectric in the trench using a polymer fill. The polymer fill process is performed prior to the isotropic etch; an organic polymer is spun on the wafer to fill the trench, and the polymer is recessed by plasma etching to the top of the trench. After the isotropic etch, the polymer fill is ashed away using an oxygen plasma. If desired, the structure may then be annealed in Hydrogen, or Hydrogen/Carbon Monoxide to reduce the carbon nanotube catalyst 106 (the catalyst may become oxidized during trench dielectric formation, making this step unnecessary). This step would be necessary if the catalyst becomes oxidized, and the reduced metal is preferred as the catalyst. Iron and Nickel oxides can also act as carbon nanotube catalysts, so this reduction step may not be required.

Figure 3:
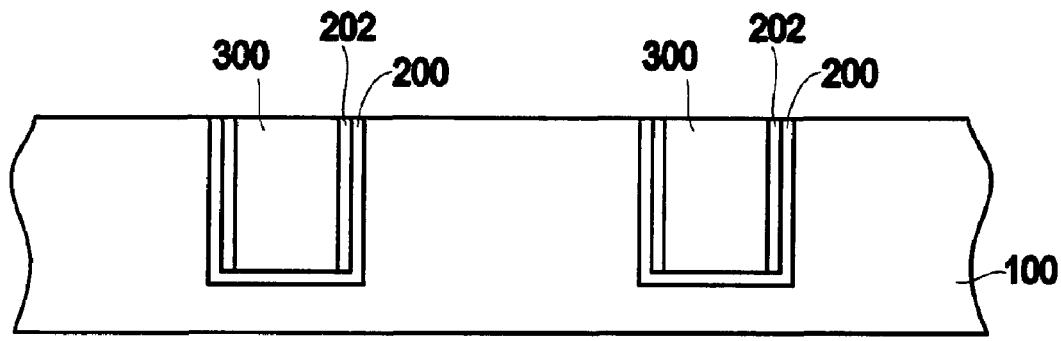
FIG. 3 is a schematic diagram of a partially completed trench-type storage device.

The invention then introduces the carbon nanotube formation gas (such as carbon monoxide, acetylene, ethylene, or other suitable carbon sources) at elevated temperature (such as 500-900° C.), to allow a plurality of (multiple) carbon nanotubes 202 to grow down into the trench from the catalyst at the bottom of the pad structure. As shown in FIG. 3, the invention then fills the remaining portion of the trench with a trench conductor 300 (e.g., polysilicon, metal, alloy, etc.) that becomes in direct contact with the plurality of carbon nanotubes 202 as shown in FIG. 3, as in a conventional fill process, and planarizes the structure.

Figure 4:
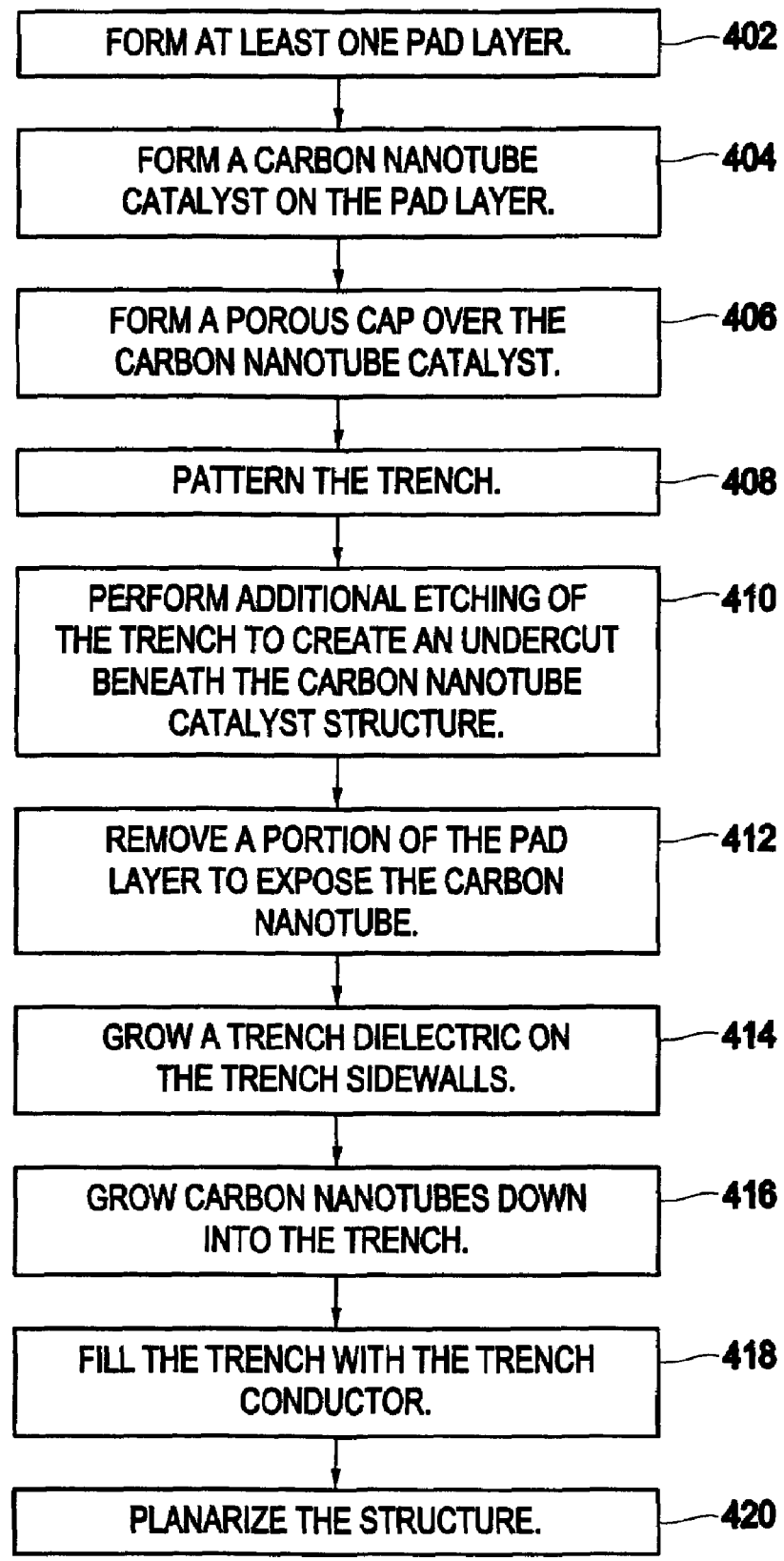
FIG. 4 is a flow diagram illustrating a preferred method of the invention.

A process for producing the structure of the present invention is shown in flowchart form in FIG. 4. More specifically, the invention forms a carbon nanotube catalyst structure on a substrate and patterns at least one trench in the substrate. The invention forms the carbon nanotube catalyst structure by first forming a least one pad layer (step 402) and then forming a carbon nanotube catalyst on the pad layer (step 404). Prior to growing the carbon nanotubes, the invention can form a porous cap over the carbon nanotube catalyst (step 406). After the trench is patterned (step 408), the invention performs additional etching of the trench to create an undercut beneath the carbon nanotube catalyst structure (step 410). Next, the trench dielectric is formed on the trench sidewall (step 412).

A portion of the trench dielectric and a portion of the pad layer are then removed, to expose the carbon nanotube catalyst (step 414). Then, the invention grows carbon nanotubes down into the trench (step 416), after which the invention fills the trench with a conductor (step 418). The inventive process grows the carbon nanotubes from the top opening portion of the trench, down sidewalls of the trench, to the bottom closed portion of the trench. The carbon nanotubes form a consistent lining along approximately the entire length of sidewalls of the trench. The trench conductor comprises one or more of polysilicon, metal, an alloy, etc., and is carbon free. Lastly (step 420), the structure is planarized down to the top of the substrate 100. Thus, in the final structure, this area of the substrate is free of carbon nanotube catalyst materials.

As shown above, the present invention places the catalyst at the top of the trench, and allows the carbon nanotubes to grow down into the trench. This avoids the problems associated with conventional processes which cause the high aspect ratio trenches to be clogged with carbon nanotube material. Further, with the invention, fresh source gas is able to access the catalyst through a porous cap over the catalyst.

INDUSTRIAL APPLICABILITY

The present invention is applicable to any type of electronic storage device that utilizes trench-type capacitors. In the particular example given above, the present invention has been described with reference to a dynamic random access memory (DRAM) capacitor structure.

While the invention has been described in terms of preferred embodiments, those skilled in the art will recognize that the invention can be practiced with modification within the spirit and scope of the appended claims.

The invention claimed is:
1. A trench-type storage device comprising:
a substrate;
a trench in said substrate;
multiple conductive carbon nanotubes lining said trench; and
a trench conductor, surrounded by and in direct contact with said multiple conductive carbon nanotubes, filling said trench,
wherein said trench conductor and said substrate have a co-planar top surface.
2. The storage device in claim 1, further comprising a layer of trench dielectric on top of a bottom of said trench and between said multiple conductive carbon nanotubes and sidewalls of said trench, wherein the multiple conductive carbon nanotubes form an open cylinder structure lining said sidewalls of said trench through said layer of trench dielectric.

3. The storage device in claim 2, wherein the trench conductor comprises at least one of polysilicon, a metal, and an alloy thereof, contacting said layer of trench dielectric on top of said bottom of said trench.

4. The storage device in claim 1, characterized in that the multiple conductive carbon nanotubes and the trench conductor are disposed in the trench, and the trench conductor is carbon free.

5. The storage device in claim 1, characterized in that the substrate is free of carbon nanotube catalyst materials.

6. The storage device in claim 1, characterized in that the multiple conductive carbon nanotubes form a consistent lining along approximately the entire length of sidewalls of said trench.

7. The storage device in claim 1, characterized in that the multiple conductive carbon nanotubes are grown downwards into the trench.

8. The storage device in claim 1, further comprising a trench dielectric between said multiple conductive carbon nanotubes and sidewalls of said trench.

9. The storage device in claim 1, further comprising a trench dielectric layer directly underneath said multiple conductive carbon nanotubes.

10. The storage device in claim 9, wherein said trench dielectric layer lining at least a substantial portion of sidewalls of said trench and said multiple conductive carbon nanotubes lining said trench via said trench dielectric layer.

11. The storage device in claim 9, wherein said trench dielectric layer having a cylindrical shape, lined by said multiple conductive carbon nanotubes across sidewalls of said cylindrical shape, and filled by said trench conductor.

12. A trench-type storage device comprising:
a substrate;
at least one trench in said substrate;
multiple conductive carbon nanotubes lining said at least one trench;
a trench conductor filling said at least one trench and in direct contact with said multiple conductive carbon nanotubes; and
a trench dielectric between said multiple conductive carbon nanotubes and sidewalls of said at least one trench and directly underneath and in contact with said multiple conductive carbon nanotubes.

13. The storage device in claim 12, characterized in that the trench-type storage device is planarized so that a top surface of the substrate is coplanar with respective top surfaces of the trench dielectric, the multiple conductive carbon nanotubes and the trench conductor.

14. A trench-type storage device comprising:
a substrate;
one trench in said substrate;
conductive carbon nanotubes forming an open cylinder in lining said one trench; and
a trench conductor filling said open cylinder of said conductive carbon nanotubes and in direct contact with said conductive carbon nanotubes,
wherein said trench conductor and said substrate have a co-planar top surface.

15. The storage device in claim 14, wherein the trench conductor comprises at least one of polysilicon, a metal, and an alloy thereof, contacting a layer of trench dielectric on top of a bottom of said one trench.

16. The storage device in claim 14, characterized in that the conductive carbon nanotubes and the trench conductor are disposed in the trench, and the trench conductor is carbon free.

17. The storage device in claim 14, characterized in that the substrate is free of carbon nanotube catalyst materials.

18. The storage device in claim 14, characterized in that the conductive carbon nanotubes form a consistent lining along approximately the entire length of sidewalls of said trench.

19. The storage device in claim 14, characterized in that the conductive carbon nanotubes are grown downwards into the trench.

20. The storage device in claim 14, further comprising a trench dielectric between said conductive carbon nanotubes and sidewalls of said trench.

* * * * *